(12) United States Patent
Bahr et al.

(10) Patent No.: US 9,899,363 B1
(45) Date of Patent: Feb. 20, 2018

(54) FIN-FET RESONANT BODY TRANSISTOR

(71) Applicant: GLOBALFOUNDRIES Inc., Grand Cayman (KY)

(72) Inventors: Bichoy Bahr, Richardson, TX (US); Zoran Krivokapic, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/632,927

(22) Filed: Jun. 26, 2017

(51) Int. Cl.
  *H01L 27/02* (2006.01)
  *H01L 27/098* (2006.01)
  *H01L 23/532* (2006.01)

(52) U.S. Cl.
  CPC .... *H01L 27/0203* (2013.01); *H01L 23/53214* (2013.01); *H01L 23/53228* (2013.01); *H01L 27/098* (2013.01)

(58) Field of Classification Search
  CPC ..... H01L 21/823431; H01L 21/823821; H01L 21/845; H01L 27/0886; H01L 27/0924; H01L 27/1082; H01L 27/10879; H01L 27/1211; H01L 29/41791; H01L 29/66795–29/66818; H01L 29/7855–29/7856; H01L 2924/13067; H01L 29/04–29/045; H01L 29/16–29/1608; H01L 29/18–29/185; H01L 29/22–29/2206; H01L 29/36–29/365; B81B 2201/0271; B81B 3/0021; H03H 9/2405; H03H 2009/02314; H03H 2209/241; H03H 3/0072

See application file for complete search history.

(56) References Cited

U.S. PATENT DOCUMENTS

| | | |
|---|---|---|
| 9,520,510 B2 | 12/2016 | Xue et al. |
| 9,663,346 B1 | 5/2017 | Bahr et al. |
| 9,673,376 B1 | 6/2017 | Krivokapic et al. |
| 2012/0001229 A1 | 1/2012 | Zhu et al. |
| 2012/0223331 A1 | 9/2012 | Zhu et al. |
| 2012/0299175 A1 | 11/2012 | Tran |

OTHER PUBLICATIONS

U.S. Appl. No. 15/632,909, filed Jun. 26, 2017, titled Fin-FET Resonant Body Transistor.

*Primary Examiner* — Tucker J Wright
(74) *Attorney, Agent, or Firm* — Heslin Rothenberg Farley & Mesiti P.C.; Nathan B. Davis (57) ABSTRACT

Circuit structures including a FinFET resonant body transistor are disclosed. One circuit structure includes: a plurality of fins over a substrate and a plurality of gate structures over the plurality of fins, the plurality of gate structures comprising at least one voltage sensing gate, and at least two of the plurality of fins comprising multiple pn-junctions disposed on opposing sides of the at least one voltage sensing gate, the multiple pn-junctions being fabricated to operate as driving units; at least one phononic crystal, wherein the at least one phononic crystal is arranged to confine vibrational energy arising from electrically induced mechanical stresses in the fins comprising driving units; and, wherein the electrically induced mechanical stresses modulate carrier mobility in the at least one voltage sensing gate to produce a current extractable by the circuit structure.

20 Claims, 12 Drawing Sheets

RF AND DC APPLIED TO G WITH S & D GROUNDED

FIG. 3B

DC APPLIED TO G WITH S (OR D) GROUNDED, AND DC + RF APPLIED TO D (OR S)

FIG. 3C

DC APPLIED TO G, WITH DC + RF APPLIED TO S AND D TOGETHER

FIN-FET RESONANT BODY TRANSISTOR

FIELD OF THE INVENTION

The present invention relates to semiconductor devices and methods of fabricating semiconductor devices, and more particularly, to devices and methods of forming a FinFET resonant body transistor including a phononic crystal.

BACKGROUND OF THE INVENTION

For digital electronics and RF communication systems, high-Q (quality factor) filters are essential components for creating oscillators. They can be incorporated into a positive feedback loop with amplifiers to provide adequate gain. They can also be used as a clock source for digital electronics. High-Q filters are also used in communication systems for selecting specific bands and channels, for eliminating interferers, and suppressing spurious transmissions. A higher Q factor shows better selectivity for channels and bands, as well as lowering phase noise and jitter for oscillators constructed by the filters. Typically, mechanical resonators show superior performance over the electrical, such as LC, or tank, circuits.

As these devices shrink, the need for reduced size, weight, and power consumption requires complete system integration on the chip. Additionally, filters don't traditionally scale to GHz or higher frequency bands.

Therefore, it is desirable to develop a MEMS FinFET Resonant Body Transfer.

BRIEF SUMMARY

The shortcomings of the prior art are overcome and additional advantages are provided through the provisions, in one aspect, a circuit structure including a FinFET resonant body transistor that includes, for instance: a plurality of fins over a substrate and a plurality of gate structures over the plurality of fins, the plurality of gate structures including at least one voltage sensing gate, and at least two of the plurality of fins including multiple pn-junctions disposed on opposing sides of the at least one voltage sensing gate, the multiple pn-junctions being fabricated to operate as driving units; at least one phononic crystal, wherein the at least one phononic crystal is arranged to confine vibrational energy arising from electrically induced mechanical stresses in the fins including driving units; and, wherein the electrically induced mechanical stresses modulate carrier mobility in the at least one voltage sensing gate to produce a current extractable by the circuit structure.

BRIEF DESCRIPTION OF THE SEVERAL VIEWS OF THE DRAWINGS

One or more aspects of the present invention are particularly emphasized and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit devices disclosed herein provide for a FinFET resonant body transistor.

Figure 1:
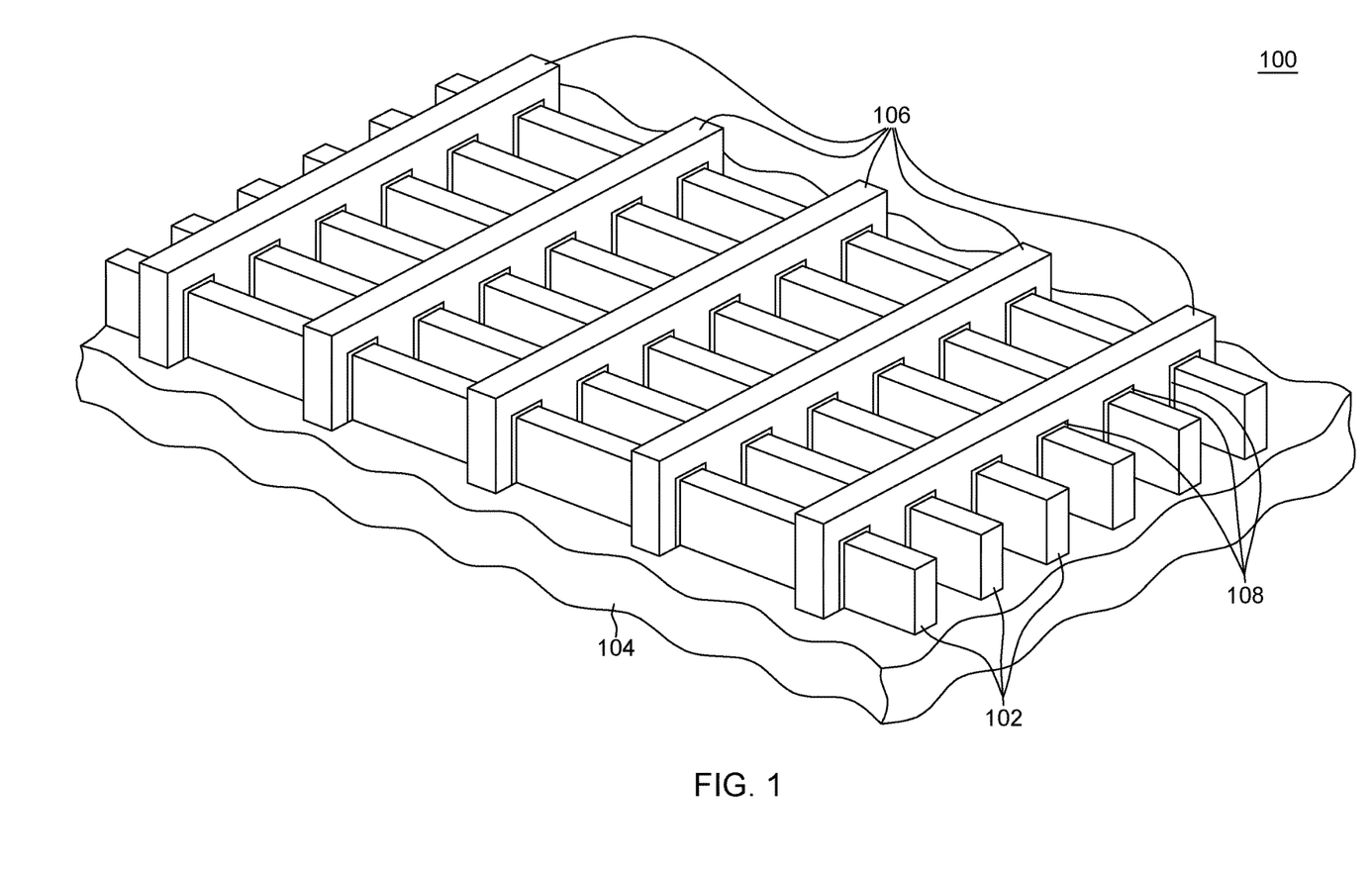
FIG. 1 depicts an isometric view of one embodiment of a circuit structure, in accordance with one or more aspects of the present invention.

In one aspect, according to one embodiment, as shown in FIG. 1, a circuit structure 100 of an integrated circuit can include a FinFET resonant body transistor (fRBT). For instance, the circuit structure 100 may include a plurality of fins 102 over a substrate 104. Substrate 104 may include silicon or a doped silicon material. In another embodiment (not shown), the substrate of circuit structure 100 may be, for example, a silicon on insulator (SOI) substrate (not shown). For example, the SOI substrate may include an isolation layer (not shown), which may be a local buried oxide region (BOX) or any suitable material for electrically isolating transistors, aligned with the gate structure. In some embodiments, the device is a portion of a back end of line (BEOL) portion of an integrated circuit (IC). The plurality of fins 102 may be the same material as the substrate 104, or may be formed of a differing material formed in an intermediate step, including semiconductors such as silicon, germanium, silicon germanium, or other III-V compounds.

The circuit structure 100 may also include a plurality of gate structures 106, which may run perpendicular to a direction of the plurality of fins 102, covering them in some embodiments. There may be a gate dielectric 108, including but not limited to a high-k dielectric, an insulator, or an oxide, surrounding the plurality of fins 102 where the plurality of gate structures 106 contact the fins 102. The plurality of gate structures 106 can include a poly-silicon gate, a metal gate, or a replacement metal gate. The plurality of gate structures 106 may include multiple barrier layers and/or etch stop layers (not shown). At least one of the plurality of gate structures 106 can include at least one voltage sensing gate. Additionally, any of the plurality of gate structures 106 may include dummy gates, and any of the plurality of fins 102 can include dummy fins. Disposed on either side of the voltage sensing gate may be a plurality of pn-junctions, which could be disposed on opposing sides of the at least one voltage sensing gate. The pn-junctions can include at least some of the plurality of fins and are fabricated to operate as driving units.

For instance, the pn-junctions may be fabricated directly in the plurality of fins, including by implanting the fins with both p-type and n-type ions, or by selective etching and selective epitaxial growth of in-situ doped p-regions in n-doped fins or n-regions in p-doped fins. The pn-junctions may be silicided by any process. While a voltage sensing gate is described, these pn-junctions may also function as the voltage sensing device, either alone or in conjunction with a voltage sensing gate.

In some embodiments, there may be a plurality of voltage sensing gates, and adjacent voltage sensing gates may have opposing electrical biases applied. Additionally, the driving units on one side of the at least one voltage sensing gate can have opposing electrical biases applied to them, and there may be a plurality of driving units.

Figure 2:
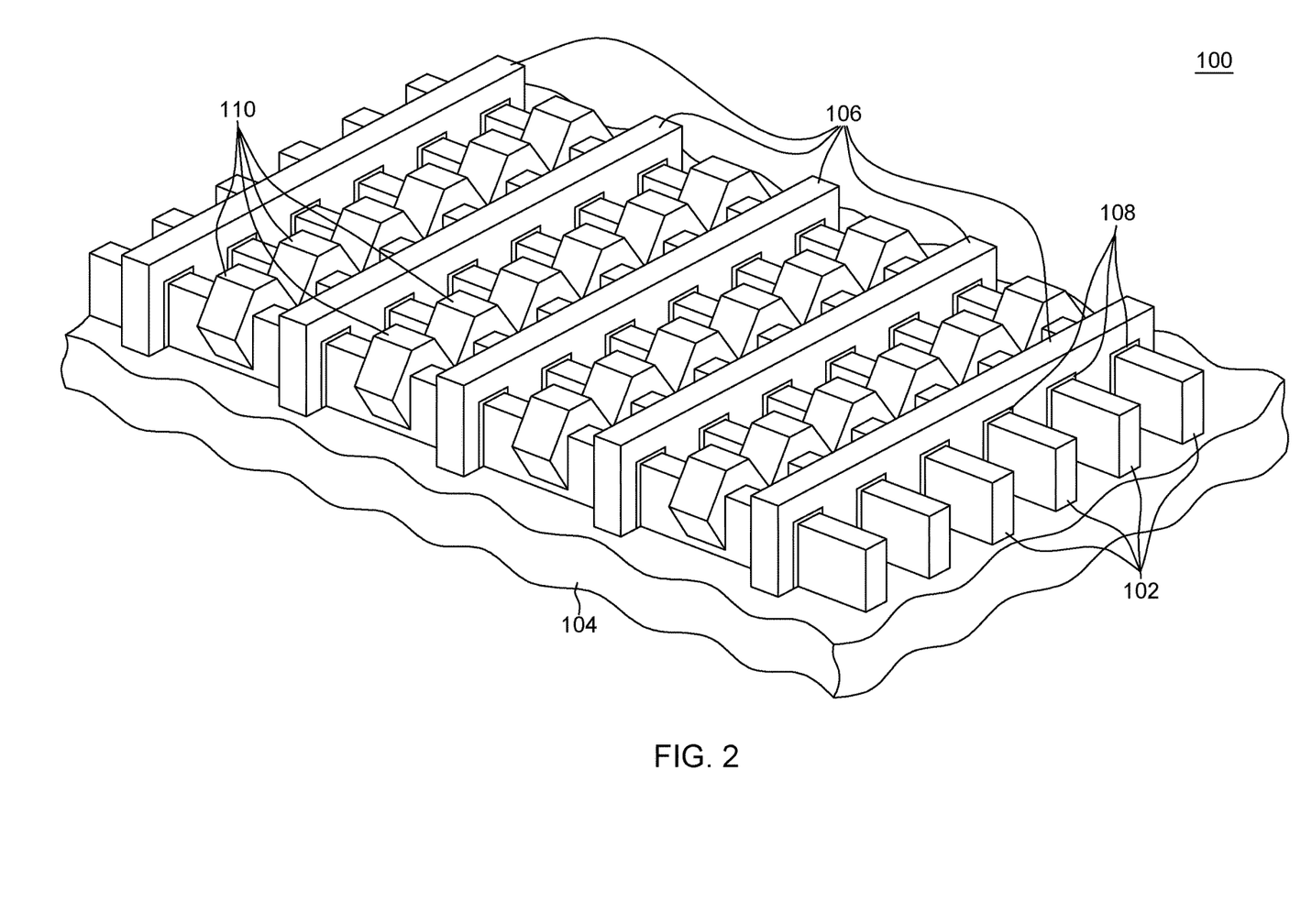
FIG. 2 depicts an isometric view of one embodiment of a circuit structure, in accordance with one or more aspects of the present invention.

Turning to FIG. 2, the circuit structure 100 may also include a plurality of source/drain (S/D) regions 110, which may include epitaxially grown source and/or drain regions. S/D regions can include a silicide layer (not shown) above the S/D region.

A circuit structure 100 as shown in FIGS. 1-2 can have a natural mechanical vibration mode, or a plurality of modes, which are sometimes referred to as eigenmodes, which occur at specific and discrete natural resonance frequencies (eigenfrequencies), and can be excited and sensed with proper transduction mechanism, as described herein. As will be described below, phononic crystal (PnC) structures can be used to confine the mechanical vibrations of a circuit structure 100. In order to excite the natural vibrational modes, a source of mechanical stress in incorporated. The voltage difference between the plurality of gate structures 106 and the plurality of S/D regions 110 creates a charge in the gate capacitance, including an electrostatic attraction force, creating the mechanical stress. Modulation of this voltage causes a modulation of the electric charge, and this combined with the mechanical stress can launch elastic vibrational waves in circuit structure 100.

Figure 3A:
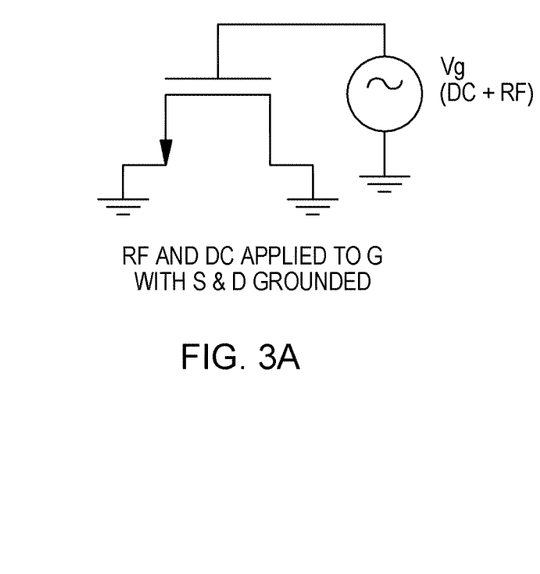
FIGS. 3A-C depict a schematic for use in embodiments of a circuit structure, in accordance with one or more aspects of the present invention.
Figure 3B:
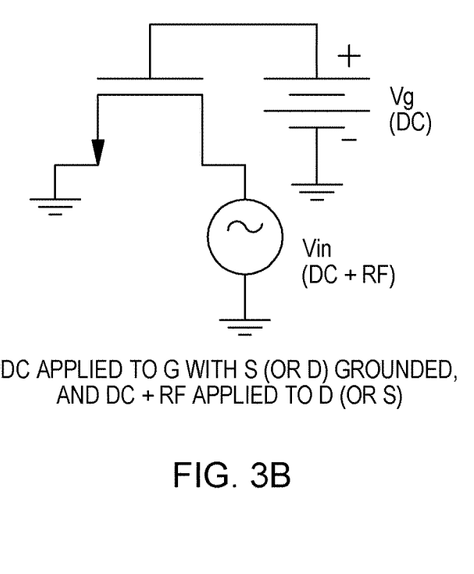
Figure 3C:
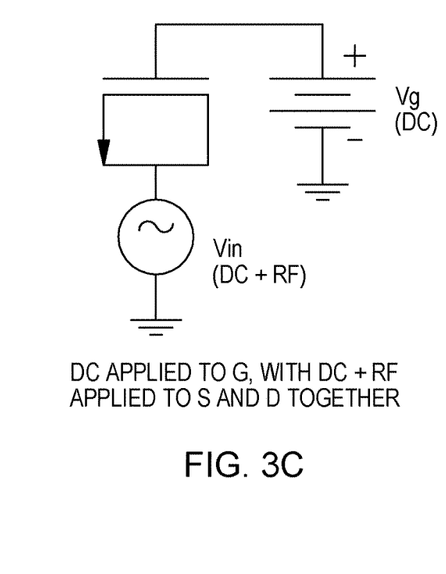

Turning to FIGS. 3A-3C, there are multiple methods of exciting the eigenmodes. For instance, the source and drain regions 110 can be biased with separate or common DC voltage source(s), making them an RF ground, or can be directly connected to a ground. Additionally, a DC bias can be applied to the plurality of gates 106, and/or the pn-junctions, which in connection with the S/D region bias, can operate at a predetermined regime, including the accumulation, depletion, inversion, or weak inversion. Finally, in order to modulate the charge and generate electrostatic force and mechanical stress, an RF signal can be applied to either the gates 106, one of the source or drain of the S/D regions 110, or both the source and the drain of the S/D regions 110, and/or the pn-junctions. FIG. 3A illustrates a circuit diagram with the RF and DC applied to a ground, with the S/D regions 110 grounded. FIG. 3B illustrates a circuit diagram of the DC being applied to a ground with the source or drain grounded, and a DC and RF applied to the other of the source or drain. FIG. 3C illustrates the circuit diagram of the DC applied to a ground, with the DC and RF applied to both the source and drain regions of S/D regions 110.

Figure 4:
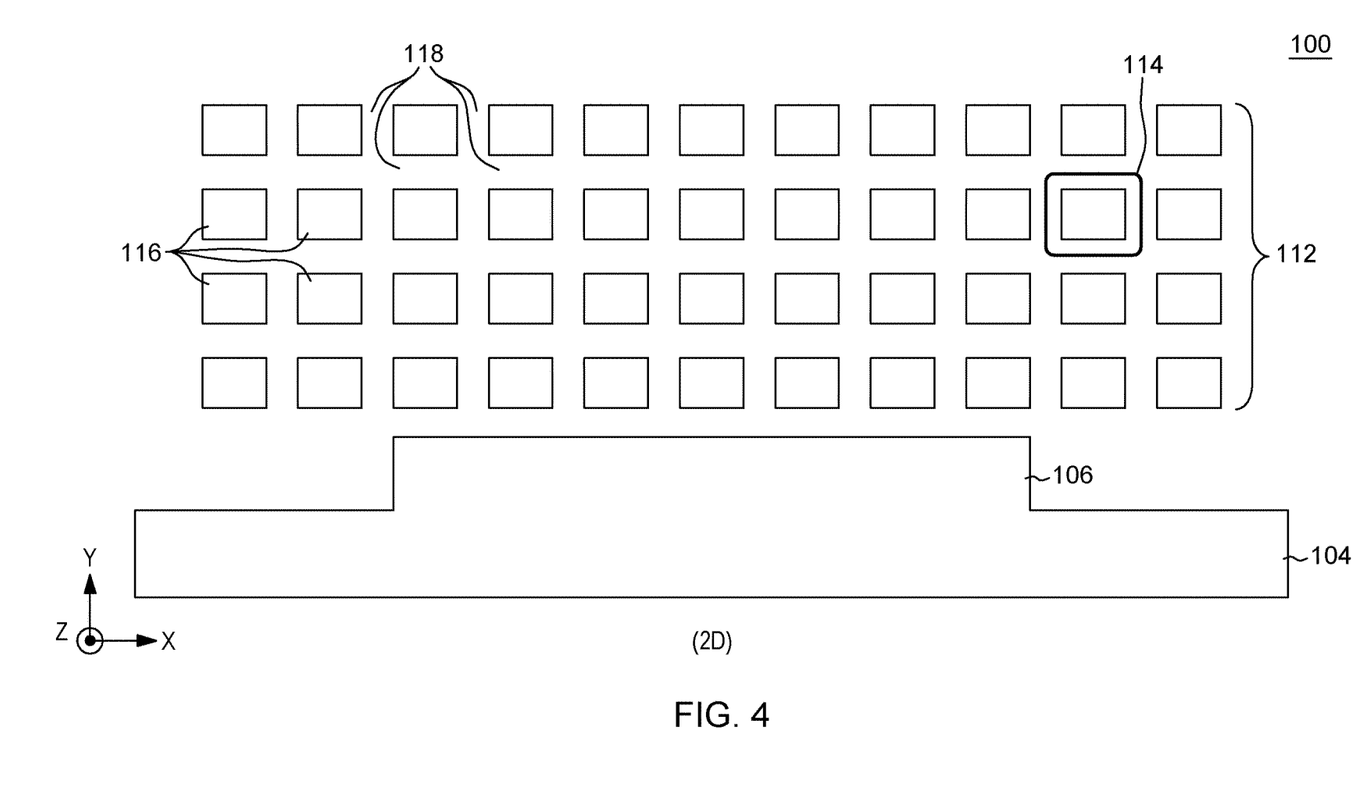
FIG. 4 depicts a side elevation view of a circuit structure, in accordance with one or more aspects of the present invention.

Turning to FIG. 4, the circuit structure 100 may include at least one phononic crystal 112. In some embodiments, the phononic crystal 112 includes a plurality of phononic crystal unit cells 114 which are disposed over the plurality of gate structures 106. The phononic crystal 112 is arranged to confine the vibrational energy, as described above, arising from electrically induced mechanical stresses in the fins disposed below the driving junction gates of the plurality of gates 106. The electrically induced mechanical stresses modulate a carrier mobility in the at least one voltage sensing gate in order to produce a current which is extractable by the circuit structure 100. The at least one phononic crystal 112 may be a 1 dimensional (D), 2D, or 3D structure, and may include a back end of line (BEOL) structure, having a partial or full bandgap that is approximately the same as the natural frequency which needs to be extracted and confined.

Figure 5:
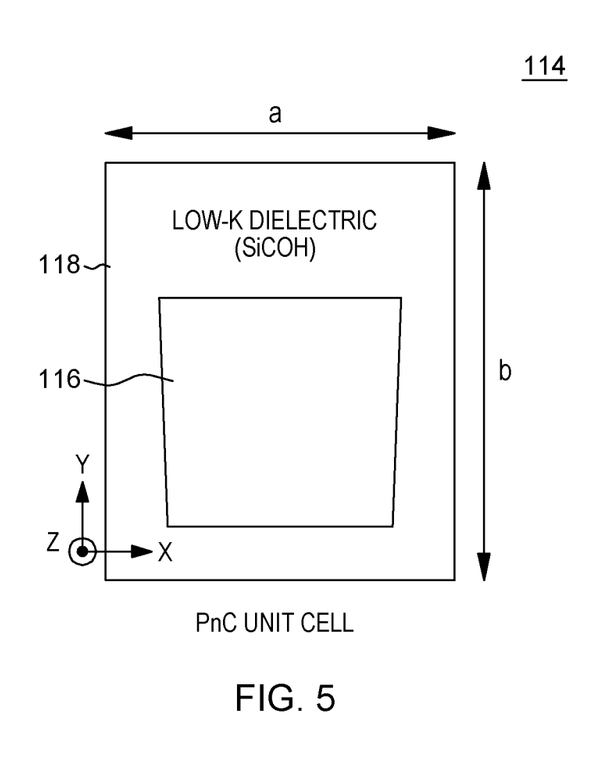
FIG. 5 depicts a close up view of a phononic crystal unit, in accordance with one or more aspects of the present invention.

As illustrated in FIG. 5, the phononic crystal unit cells 114 can include a metal 116, for instance from a metallization layer, which may include but is not limited to copper, aluminum, tungsten, titanium, and other similar metals. Surrounding metal 114 on at least two sides, but in some instances all four sides, is an insulating material, for instance an interlayer dielectric (ILD) material 118, which can include copper capping layers; etch stop layers; diffusion barriers; antireflection coatings; low-k dielectric materials including but not limited to SiCOH, SiOCN, SiCN, SiN, and combinations of these dielectric materials; or a combination of these materials.

Figure 6:
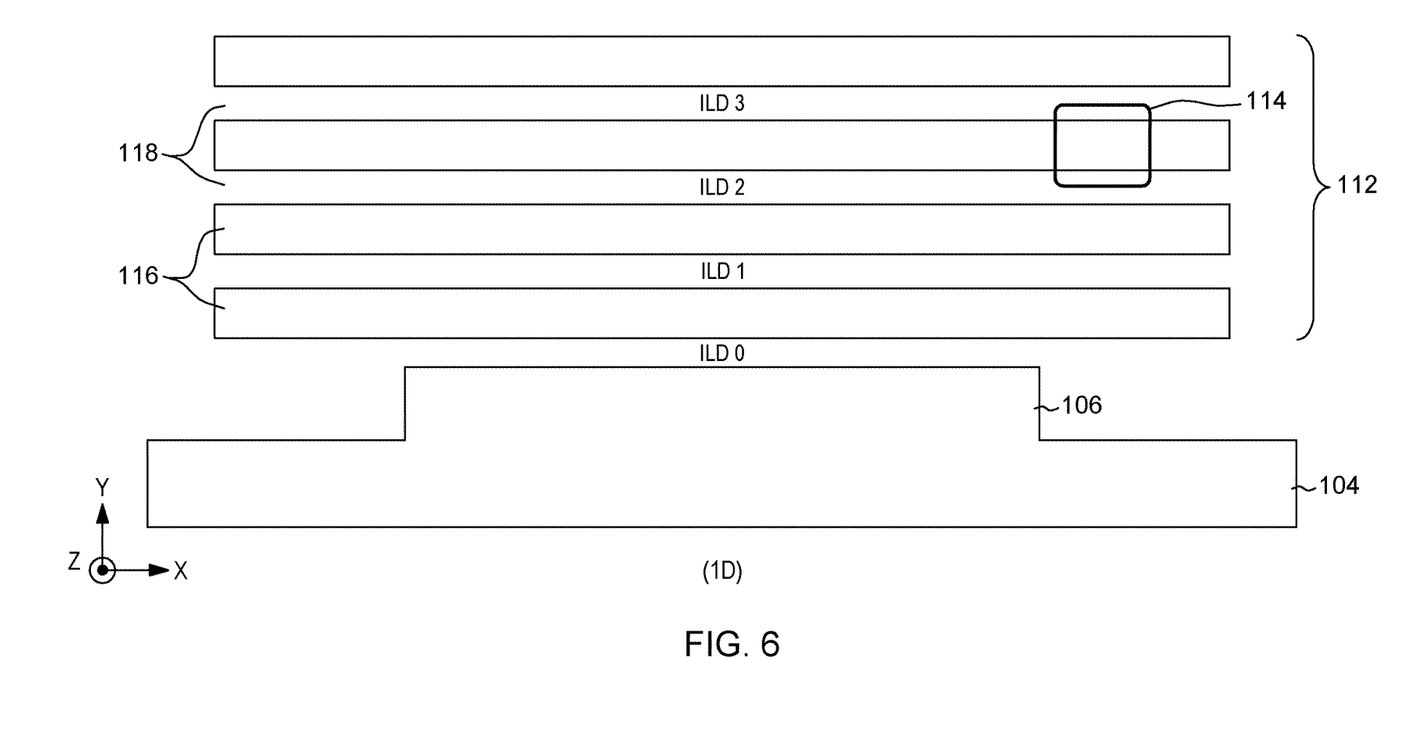
FIG. 6 depicts a side elevation view of a circuit structure, in accordance with one or more aspects of the present invention.

FIG. 6 depicts an embodiment including wherein the plurality of phononic crystal (PnC) unit cells are disposed in one or more metallization layers of the circuit structure 100. For instance, metal 116 can include a metallization layer, essentially a plate of metallization material, disposed over the plurality of gate structures 106. Disposed between metal plates 116 and the plurality of gate structures 106 can be ILD material 118 in the form of plate-like layers as well. In these embodiments, the PnC 112 is considered a 1D PnC. In some embodiments, the plates of metal 116 may be formed of metal lines which are in electrical contact with one another rather than a single metal layer.

Returning to FIG. 4, a 2D PnC 112 is depicted. In these embodiments, the metallization layers, as depicted in FIG. 6, can include metal lines 116, which are electrically isolated from adjacent metallization layers by an insulating material, for instance ILD material 118. In some embodiments, each metal line is isolated from one another. The metal lines 116 may be oriented either parallel or perpendicular to a length of the plurality of fins 102. The metal lines 116 may have a line width which is less than a pitch dimension of the plurality of gate structures 106.

In either of the above embodiments, 1D or 2D PnC 112, or a 3D PnC (not pictured), one or more layers of metal lines 116 can be utilized. In some embodiments, four or more metallization layers may be utilized, with ILD materials 118 between each. The higher metallization layers 116 may become thicker and have a larger critical dimension (CD), and in these embodiments, each PnC unit cell 114 can be designed for each layer, tuning the bandgap to fully or partially align, thus increasing the reflectivity for the whole PnC 112.

Figure 7A:
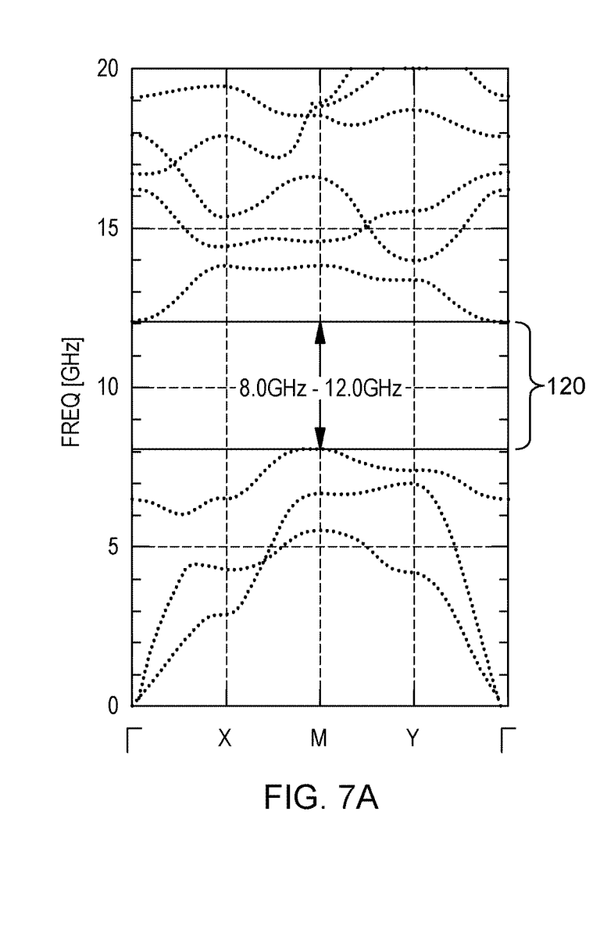
FIGS. 7A-C depict example bandgap structures of a circuit structure, in accordance with one or more aspects of the present invention.
Figure 7B:
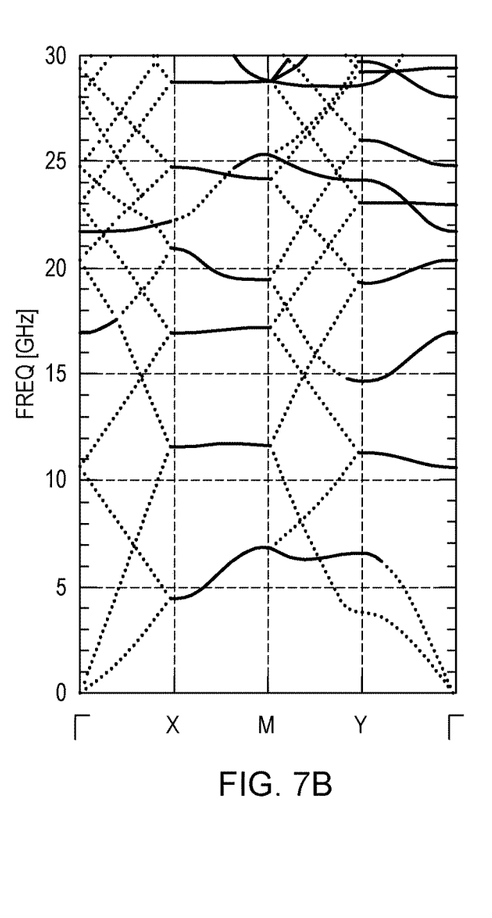
Figure 7C:
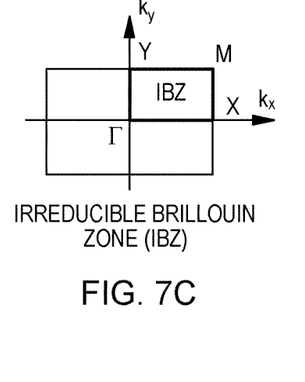

For instance, as seen in FIG. 7A, a bandgap of a single PnC unit cell 114 can be tuned to have a bandgap between 8 gigahertz (GHz) and 12 GHz. However, as seen in FIG. 7B, multiple partial bandgaps 121-126 can be tuned to increase the reflectivity of PnC 112. These bandgaps and partial bandgaps can be determined using the Irreducible Brillouin Zone (IBZ), illustrated in FIG. 7C. Partial bandgaps, especially for 1D PnCs 112, can be determined in the X-M direction in k-space, wherein $k_x=\pi/a$ and k/a and $k_y=\pi/b$, assuming values from 0 to $\pi/b$. Thus, in some embodiments, a 1D PnC may be tunable to higher frequencies than 2D PnCs, and are only affected by the thickness of the layers used, rather than the multi-plane dimensions of a 2D PnC, and thus determination of which type to use depends of the device.

In some embodiments, a width of the plurality of gate structures 106 is proportional to a frequency of the electrically induced mechanical vibrations of the fins 102 below the driving junction gates.

In any of the embodiments described above, the PnC 112 can confine the vibrational energy and/or reflect the vibrational energy. For instance, in some embodiments, lateral confinement may occur by the abrupt termination of the periodic gate and fin structure, and dummy gates and/or dummy fins can assist is this confinement in a lateral direction. This period structure and abrupt discontinuity may cause reflection of the vibrational energy in a downward direction, for instance into substrate 104, and the substrate may be capable of dissipating the vibrational energy. The PnC 112 may be capable of absorbing some of the energy, or of reflecting it partially or entirely into the substrate 104 below. In a further embodiment, the at least one voltage sensing gate can be used to produce a current in the fin directly below the voltage sensing gate, using the mechanical stresses modulating carrier mobility in the voltage sensing gate, resulting in the vibrational energy having a frequency that may be confined partially or entirely by the PnC 112. The current which is extractable by the circuit structure 100 may include a radio-frequency (RF) electrical current.

For instance, in bottom confinement through the substrate 104, the substrate can be considered as approximately infinite in size in comparison to the wavelengths necessary. The eigenmodes are just plane waves, with linear dispersion relation as $\omega=c|k|$, where c is the wave velocity in the bulk wafer (for both longitudinal and shear waves) and $|k|$ is the magnitude of the total wave vector that is composed of $k_x$ and $k_y$. A certain $k_x$ component can be enforced by having an excitation with certain spatial periodicity. For this case it is convenient to write the dispersion relation of the plane waves in the bulk as $\omega>c\ k_x$ (where $k_y$ is allowed to assume arbitrary values for given $k_x$). Thus, for a given $k_x$ (imposed by excitation periodicity), waves with frequency $\omega>c\ k_x$ can freely propagate in the bulk wafer.

For a given $k_x$, waves with frequency $\omega<c\ k_x$ will decay evanescently in the bulk wafer, resulting in a total reflection from the latter. This phenomena is similar to the total internal reflection in optics. As the gates array is periodic with period a, the dispersion relation of the full fRBT vertical stack (the one period shown on slide 33), will be periodic in $k_x$ with period $k_x=2\pi/a$. For this structure periodicity, the highest frequency to achieve total internal reflection from the bulk wafer happens at $k_x=\pi/a$ and is given by $\omega=c\ \pi/a$. Since the velocity of the shear waves is always slower than that of the longitudinal waves for the bulk wafer, the maximum frequency is limited by the shear sound velocity. $k_x=\pi/a$ corresponds to having the stresses in neighboring periods of the structures (in this case, neighboring gates) to be 180° out-of-phase. Thus, natural vibrational modes with $k_x=\pi/a$ and frequency lower than $\omega=c_{Shear}\ \pi/a$, will be completely reflected from the bulk wafer. If the frequencies of such modes also fall into the bandgap of the PnC structure above, they will get reflected from the PnC as well and hence become trapped in the FEOL layers between the BEOL PnC and the bulk wafer, achieving total vertical confinement.

The resonance frequency of the different fRBT vibrational modes may be set by the gate length and pitch, among the other structure dimensions. The specific relation between frequency and dimensions depend on the actual gate and fin geometry and the actual energy distribution in the natural vibrational mode. However, in general, the resonance frequencies will decrease as the structure dimensions becomes bigger. Thus, using, for example, gate lengths as small as 45 nm and a gate pitch down to 125 nm, it is possible to obtain natural vibrational modes for the corresponding fRBT structures up to 15 GHz. For example, using the natural resonance modes of an fRBT with gate length of 80 nm and gate pitch of 190 nm, modes can be obtained from 3D finite element method (FEM) simulation, assuming periodic boundary conditions. The device uses a 2D PnC with 130 nm metal width and same pitch as the underlying device gates, and shows a strong resonance mode at 10 GHz, as indicated by the ratio between the average stress in the device gate/fin region to the average stress in the entire structure.

Figure 8:
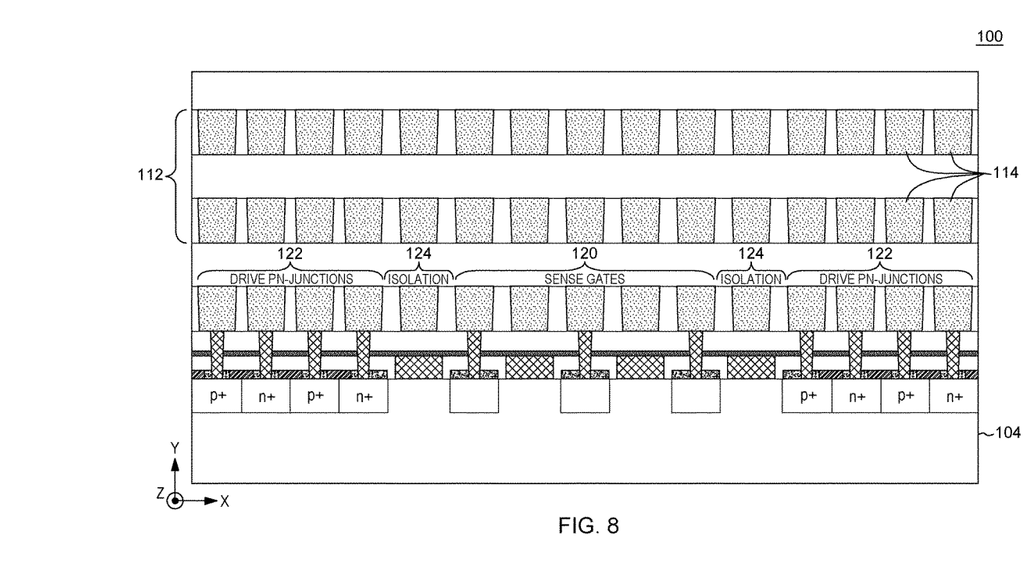
FIG. 8 depicts a side elevation view of a circuit structure, in accordance with one or more aspects of the present invention.
Figure 9:
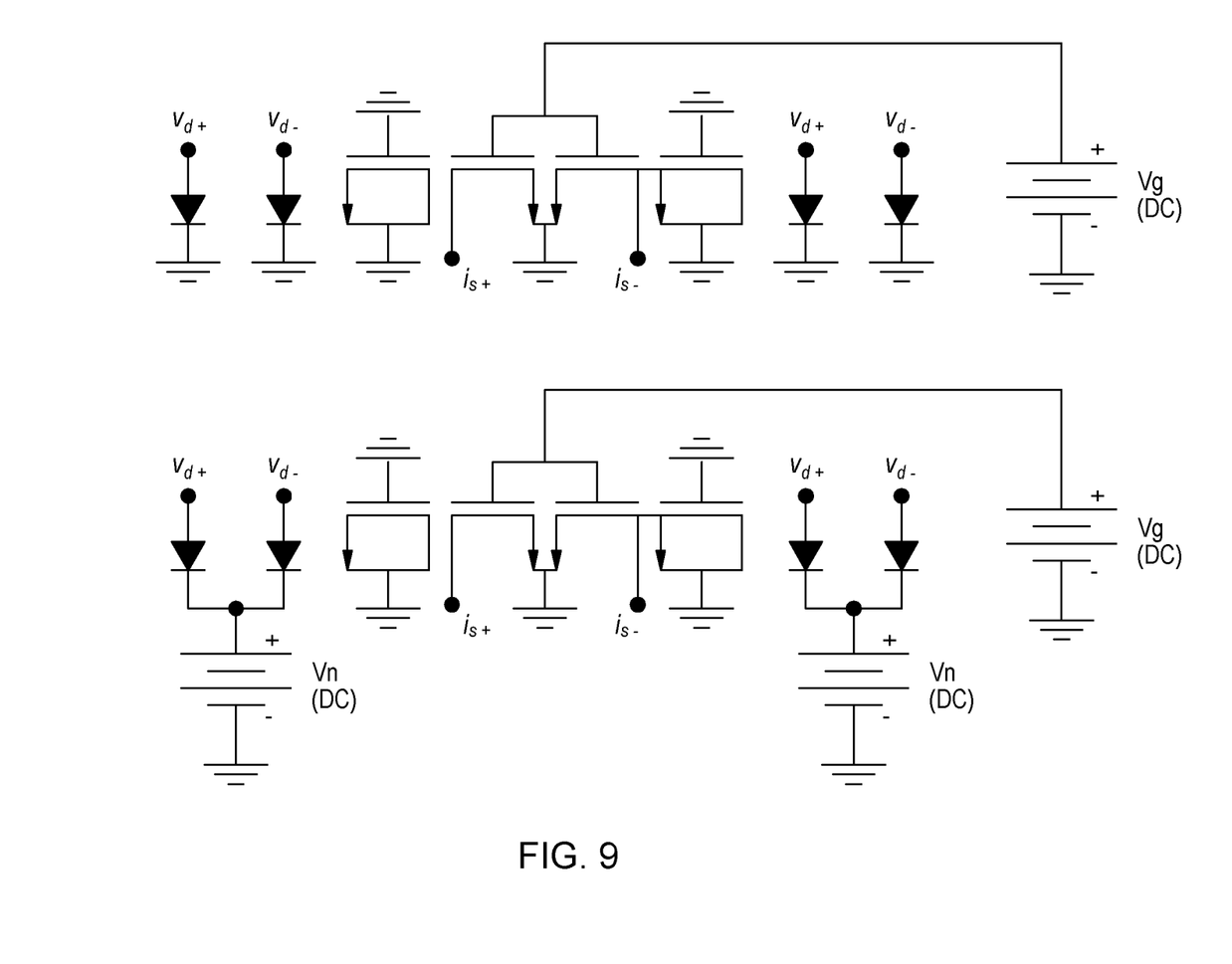
FIG. 9 depicts a schematic for use in embodiments of a circuit structure, in accordance with one or more aspects of the present invention.

FIG. 8 illustrates a final device 100 as viewed from the X-Y plane. As can be seen, the voltage sensing gates 120 can include the center gates and the drive units 122 can include the surrounding gates of the structure as seen in FIGS. 2 and 4. Isolation gates 124 may be included between voltage sensing gates 120 and drive units 122. This device can be fully differential in both drive and sense terms, which allows for an insensitivity to common mode noise and can reduce RF signal injected into substrate 104. An increase in performance occurs when the middle sensing gates 120 are surrounded by drive units 122 on both sides. When needed for electrical isolation, any number of finFETs 124 may be utilized between the sense gates 120 and drive units 122. These isolation finFETs (not shown) may be non-connected or RF-grounded. FIG. 9 illustrates two circuit schematics for such a drive and sense structure. When constructed of fully differential sense and drive units, the circuit structure 100 may include a single or multiple fully-differential drive units; a single or multiple fully-differential sense units; and/or a single or multiple single-ended sense units.

Figure 10A:
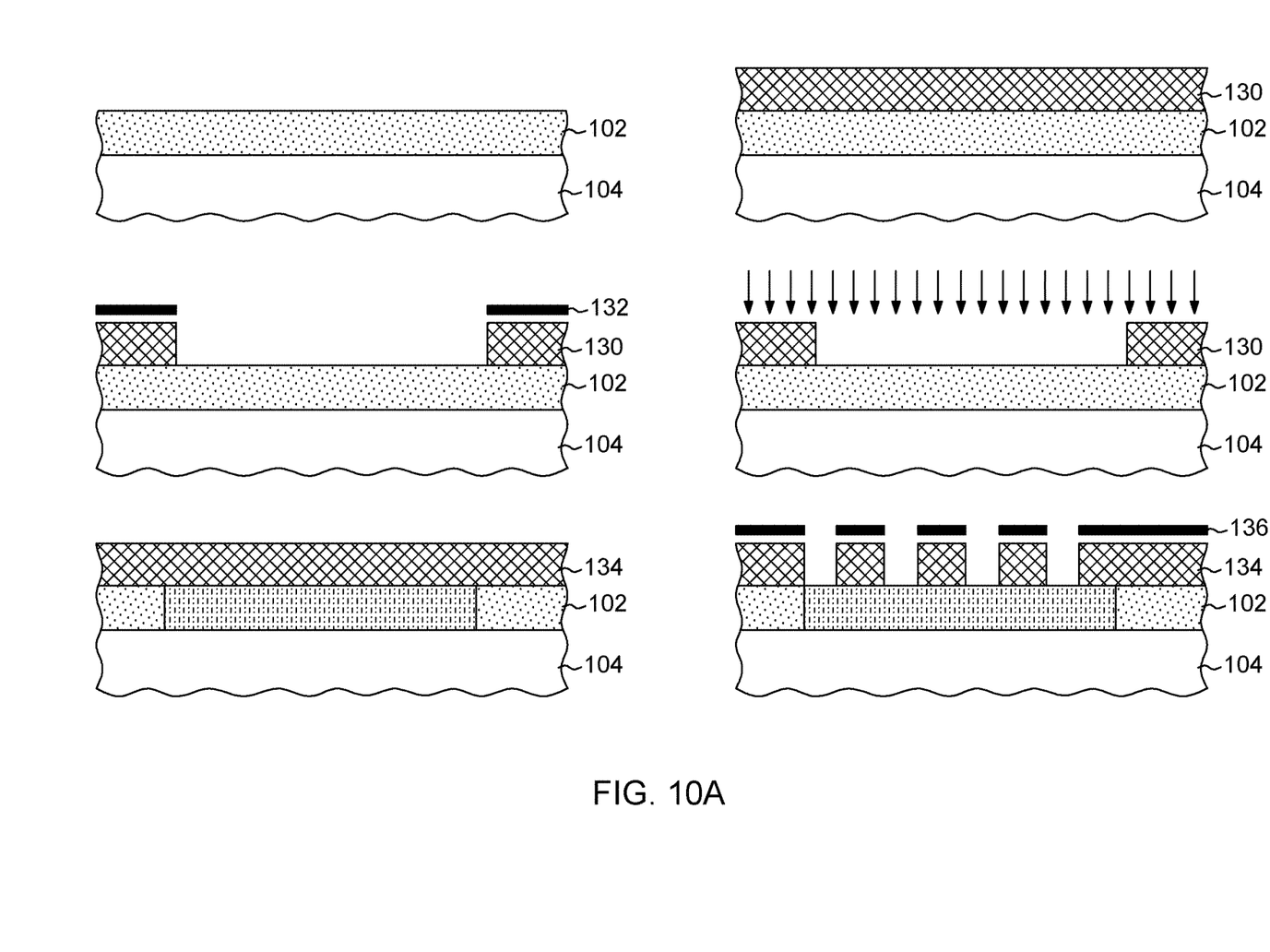
FIGS. 10A and 10B depict a process for forming pn-junctions as driving units.
Figure 10B:
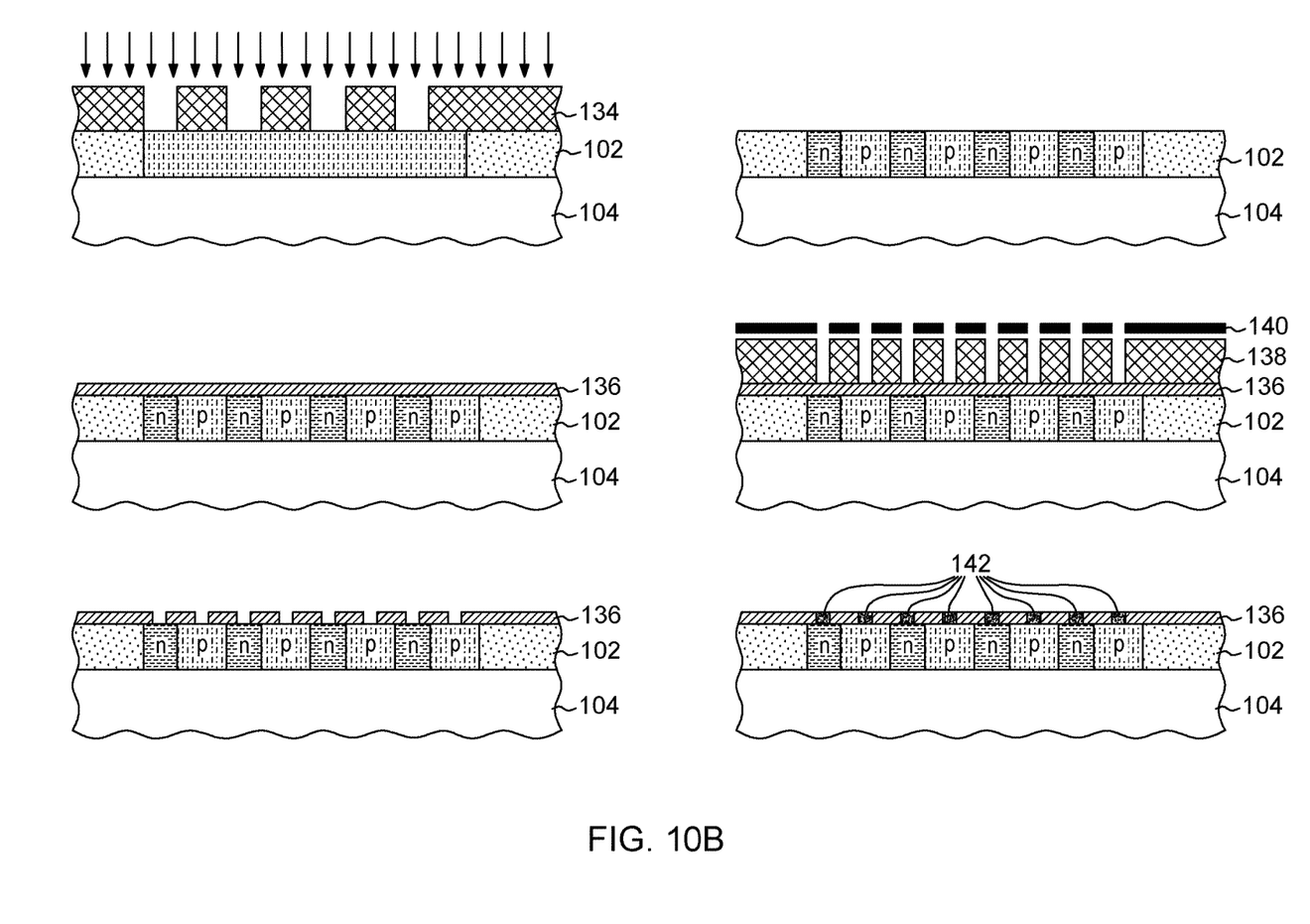

The pn-junctions 122 (FIG. 8) may be fabricated utilizing a plurality of methods. In one embodiment, as illustrated in FIGS. 10A and 10B, pn-junctions 122 may be formed in plurality of fins 102 on substrate 104. A photoresist (PR) may be spun on or otherwise deposited with sufficient thickness to act as a mask for ion implantation. After applying a mask 132 over the PR, the PR may be exposed and developed to define fin regions to be used for driving, using baking steps to ensure successful photolithography. Then boron ions can be implanted using suitable ion-implantation, in one instance with an energy of 5-25 keV at a dose of approximately $10^{14}$-$2\times10^{15}$ cm$^{-2}$. The PR 130 may then be stripped. A second PR 134 may then be applied similar to the above, and exposed and developed using a second mask 136. The exposed regions may then be implanted with, for instance, phosphorous, at an energy of 15-70 keV at a dose of approximately $10^{14}$-$2\times10^{15}$ cm$^{-2}$. The second PR 134 may then be stripped. Once the fins are annealed, the ions are activated, which may be done now or later in the process, creating the pn-junctions. A hardmask (HM) 136 may then be applied, and a third PR 138 may be deposited over the HM 136. The PR 138 may be developed using mask 140 to protect junctions of p an n sections, followed by etching the HM 136 and removing the PR 138. Silicide may then be grown using any salicidation process in the exposed areas.

Figure 11:
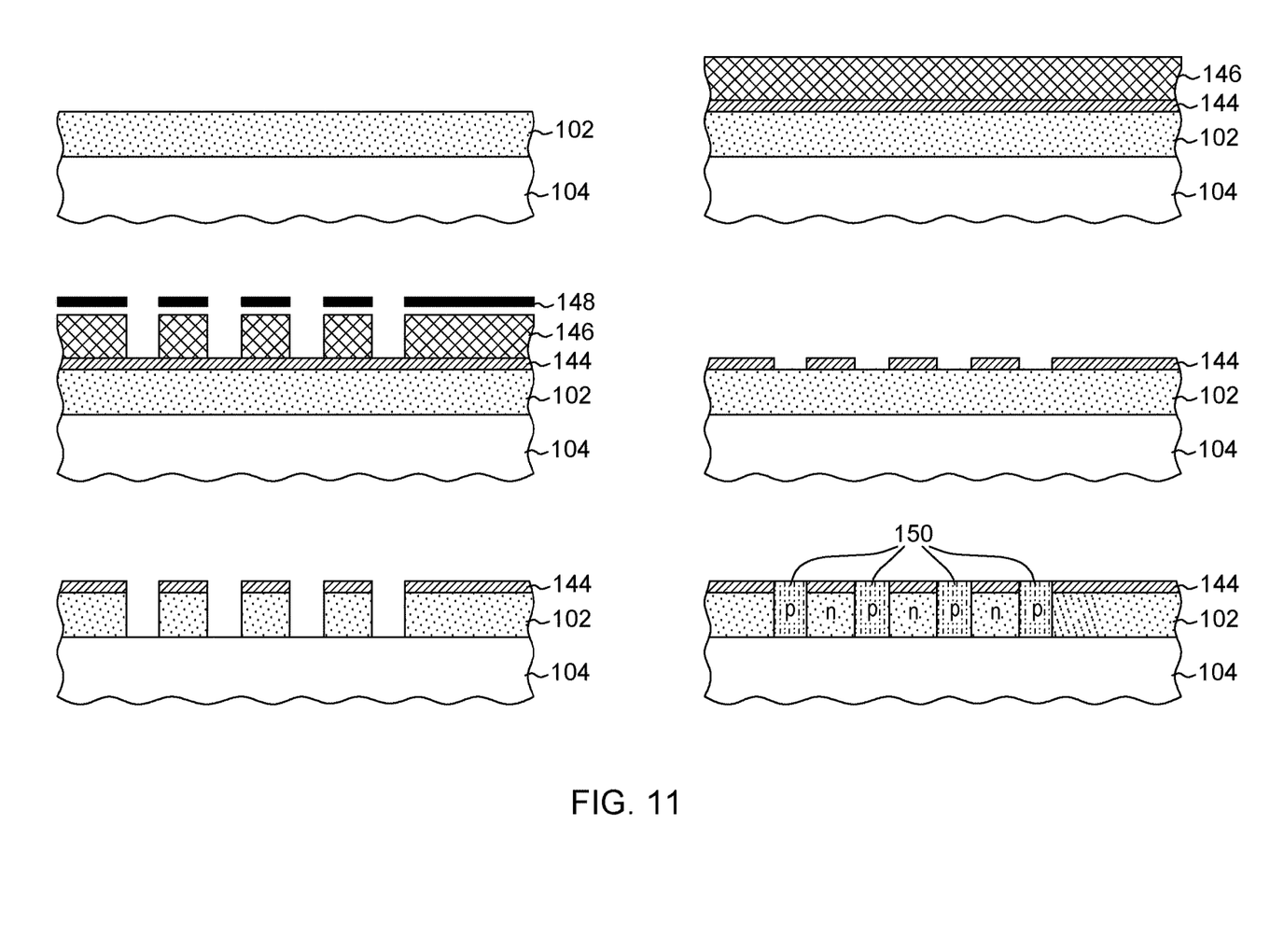
FIG. 11 depicts an alternative process for forming pn-junctions as driving units.

FIG. 11 illustrates another example fabrication process. In these embodiments, fins 102, over substrate 104, may be predoped with an n+ dopant. However, if predoped with a p+ dopant, each of the n and p references below may be reversed. Either predoping technique may be utilized. Assuming n+ doping for illustration purposes, a HM 144 may be deposited over fins 102. A PR 146 may be spun onto HM 144 and exposed through mask 148 to define the n+ regions. Etching may then be done to expose the p+ regions through the HM 144 and remove the PR 146. The fin structure 102 can then be removed in the exposed regions. Epitaxial growth of p+ doped, in situ, regions 150 may then be grown, which may include boron, gallium, or indium doping of silicon or a silicon germanium alloy. Varying the doping and/or the ratio of components of the alloy can help fine tune the frequency of the end device.

In a further embodiment, a method of operating a circuit structure including a FinFET resonant body transistor is disclosed. The method may include exciting, using at least one driving junction gate structure, at least one natural vibrational mode of the circuit structure, sensing, using at least one voltage sensing gate, the at least one natural vibrational mode of the circuit structure, modulating the at least one natural vibrational mode using the at least one driving unit, wherein modulating includes tuning a bandgap of the at least one natural vibrational mode to be within a phononic bandgap of at least one phononic crystal. The FinFET resonant body transistor may include a plurality of fins over a substrate, the at least one fin including a plurality of pn-junctions forming driving units, and at least one sensing gate being deposited over the plurality of fins. The phononic crystal may be deposited over the plurality of fins and the at least one driving junction unit and the at least one sensing gate. The bandgap and the phononic bandgap may include a frequency between approximately 8.0 GHz and approximately 12.0 GHz. In some embodiments, the at least one driving unit structure may include a plurality of driving junction units disposed on opposing sides of the at least one voltage sensing gate, and can include opposing electrical biases in adjacent driving units. The opposing electrical biases can be used in the modulation. Additionally, the at least one voltage sensing gate may include a plurality of voltage sensing gates, each adjacent voltage sensing gate having opposing electrical biases. In one embodiment, an RF signal is applied to at least one of a gate, a source, a drain, or the source and the drain. In some embodiments, the at least one phononic crystal is arranged to confine a vibrational energy caused by the exciting and modulating steps. In a further embodiment, the at least one phononic crystal is arranged to facilitate reflection of the vibrational energy into the substrate, wherein the substrate dissipates the vibrational energy. In some embodiments, the energy is completely reflected into the substrate. Alternatively, the vibrational energy may be entirely confined within the at least one phononic crystal.

It should be appreciated that the circuit structures and phononic crystals disclosed herein allow for a more tunable vibration and energy confinement within a FinFET. According to embodiments, the disclosed structure can absorb energy of higher frequencies than previously possible.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A circuit structure comprising a FinFET resonant body transistor, the FinFET resonant body transistor comprising:
   a plurality of fins over a substrate and a plurality of gate structures over the plurality of fins, the plurality of gate structures comprising at least one voltage sensing gate, and at least two of the plurality of fins comprising multiple pn-junctions disposed on opposing sides of the at least one voltage sensing gate, the multiple pn-junctions being fabricated to operate as driving units;
   at least one phononic crystal, wherein the at least one phononic crystal is arranged to confine vibrational energy arising from electrically induced mechanical stresses in the fins comprising driving units; and,
   wherein the electrically induced mechanical stresses modulate carrier mobility in the at least one voltage sensing gate to produce a current extractable by the circuit structure.

2. The circuit structure of claim 1, wherein the at least one phononic crystal comprises a plurality of phononic crystal unit cells disposed over the plurality of gate structures and multiple pn-junctions.

3. The circuit structure of claim 2, wherein the plurality of phononic crystal unit cells are disposed in one or more metallization layers of the circuit structure.

4. The circuit structure of claim 3, wherein the plurality of phononic crystal unit cells of one metallization layer comprise a plurality of metal lines, the plurality of metal lines being electrically isolated from adjacent metallization layers by an insulating material.

5. The circuit structure of claim 4, wherein the plurality of metal lines of the one metallization layer are further electrically isolated from each other by the insulating material.

6. The circuit structure of claim 5, wherein the plurality of metal lines have a line width, the line width being less than a pitch dimension of the plurality of gate structures.

7. The circuit structure of claim 5, wherein the plurality of metal lines are disposed parallel to a length of the plurality of fins.

8. The circuit structure of claim 5, wherein the plurality of metal lines are disposed perpendicular to a length of the plurality of fins.

9. The circuit structure of claim 4, wherein the plurality of metal lines of the one metallization layer are in electrical contact with each other to form a metal plane of the one metallization layer.

10. The circuit structure of claim 9, wherein the plurality of metal lines have a line width, the line width being equal to a pitch dimension of the plurality of gate structures.

11. The circuit structure of claim 4, wherein the metal of the plurality of metal lines comprises one or more of copper, aluminum, tungsten, or titanium.

12. The circuit structure of claim 4, wherein the insulating material comprises one or more of SiCOH, SiOCN, SiCN, SiOC, or SiN.

13. The circuit structure of claim 4, wherein the plurality of gate structures have a width w, the width w being proportional to a frequency of the electrically induced mechanical vibrations in the fins comprising driving units.

14. The circuit structure of claim 4, wherein the one or more metallization layers comprises four or more metallization layers, and wherein the plurality of metal lines are parallel to each other within each metallization layer and between metallization layers.

15. The circuit structure of claim 1, wherein the at least one voltage sensing gate is one voltage sensing gate of a plurality of voltage sensing gates, wherein adjacent voltage sensing gates of the plurality of voltage sensing gates have opposing electrical biases applied.

16. The circuit structure of claim 15, wherein the driving units on one side of the at least one voltage sensing gate comprise a plurality of driving units, wherein adjacent driving units have opposing electrical biases applied.

17. The circuit structure of claim 1, wherein the at least one phononic crystal being arranged to confine vibrational energy further facilitates reflection of vibrational energy into the substrate, the substrate dissipating the vibrational energy.

18. The circuit structure of claim 17, wherein vibrational energy confined by the at least one phononic crystal is completely reflected into and dissipated by the substrate.

19. The circuit structure of claim 17, wherein the mechanical stresses modulating carrier mobility in the at least one voltage sensing gate further produces a current in the fin below the at least one voltage sensing gate that modulates the vibrational energy, resulting in the vibrational energy having a frequency that may be confined completely by the phononic crystal.

20. The circuit structure of claim 1, wherein the current extractable by the circuit structure is a radio-frequency electrical current.

* * * * *